United States Patent [19]
Hughes

[11] Patent Number: 5,784,582
[45] Date of Patent: Jul. 21, 1998

[54] DATA PROCESSING SYSTEM HAVING MEMORY CONTROLLER FOR SUPPLYING CURRENT REQUEST AND NEXT REQUEST FOR ACCESS TO THE SHARED MEMORY PIPELINE

[75] Inventor: John H. Hughes, San Jose, Calif.

[73] Assignee: 3Com Corporation, Santa Clara, Calif.

[21] Appl. No.: 738,929

[22] Filed: Oct. 28, 1996

[51] Int. Cl.⁶ .................................................. G06F 15/02
[52] U.S. Cl. .................................................. 395/297
[58] Field of Search ........................ 395/496, 297, 395/298, 304, 305, 309, 405, 427, 431, 454; 365/233, 189.05, 230.03, 230.08

[56] References Cited

U.S. PATENT DOCUMENTS

| | | | |
|---|---|---|---|
| 4,755,938 | 7/1988 | Tukahashi et al. | 395/729 |
| 5,060,145 | 10/1991 | Scheuneman et al. | 365/189.04 |
| 5,416,739 | 5/1995 | Wong | 365/189.05 |
| 5,600,605 | 2/1997 | Schaefer | 365/233 |
| 5,602,781 | 2/1997 | Isobe | 365/189.05 |
| 5,630,096 | 5/1997 | Zuravleff et al. | 365/233 |
| 5,638,534 | 6/1997 | Mote, Jr. | 711/158 |
| 5,655,105 | 8/1997 | McLaury | 365/194 |

*Primary Examiner*—Moustafa M. Meky
*Attorney, Agent, or Firm*—Mark A. Haynes; Wilson, Sonsini, Goodrich & Rosati

[57] ABSTRACT

A router includes synchronous dynamic random access memory (SDRAM) based shared memory, with a controller configured to control the order in which the SDRAM access is granted to a plurality of interfaced components. In one embodiment, the controller's configuration minimizes the amount of time data from a particular source must wait to be read to and written from the SDRAM, and thus minimizes latency. In a different embodiment, the controller's configuration maximizes the amount of data read to and written from said SDRAM in a given amount of time and thus maximizes bandwidth. In yet another embodiment, characteristics of the latency minimization embodiment and the bandwidth maximization embodiment are combined to create a hybrid configuration.

16 Claims, 8 Drawing Sheets

| | | | | | | | | | | | | | | | | |
|---|---|---|---|---|---|---|---|---|---|---|---|---|---|---|---|---|
| A | A0a | R0a | | | | | | | | | | | | | x | |
| B | A0a | | D0a | D0a | D0a | D0a | D0a | D0a | D0a | | | | | | z | |
| C | A0a | W0a | D0a | D0a | D0a | D0a | D0a | D0a | | | | | | | x | |
| D | A0a | R0a | D0a | D0a | P0a | P0a | | | | | | | | | | |
| E | A0a | W0a | D0a | D0a | D0a | x | | | | | | | | | | |
| F | A0b | R0b | D0a | D0a | z | x | | | | | | | | | x | |
| G | A0b | W0b | D0b | D0b | D0b | D0b | D0b | D0b | D0b | | | | | | z | |
| H | A0b | R0b | D0b | D0b | D0b | D0b | D0b | D0b | | | | | | | x | |
| I | A0b | W0b | D0b | D0b | P0b | P0b | | | | | | | | | | |
| | A1x | R1x | D0b | D0b | D0b | z | | | | | | | | | | |
| J | A1x | W1x | D1x | D1x | D1x | D1x | D1x | D1x | D1x | | | | | x | | |
| K | A1x | R1x | D1x | D1x | D1x | D1x | D1x | D1x | | | | | | z | | |
| L | A1x | W1x | D1x | D1x | P1x | P1x | | | | | | | | x | | |
| | | | D1x | D1x | D1x | | | | | | | | | | | |
| M | Fx | | | | x | | | | | | | | | | | |

DATA PROCESSING SYSTEM HAVING MEMORY CONTROLLER FOR SUPPLYING CURRENT REQUEST AND NEXT REQUEST FOR ACCESS TO THE SHARED MEMORY PIPELINE

BACKGROUND OF THE INVENTION

1. Field of the Invention

This invention relates to memory systems in data processors and more particularly relates to high performance data processing systems, such as network intermediate systems, having shared memory.

2. Description of the Related Art

As computer networks become more wide spread, users are transferring data between their computers in greater numbers. Accordingly, network systems are under increasing pressure to transfer data in greater volumes and at higher speeds.

To interconnect networks, network intermediate systems including bridges and routers are used. These devices support the connection function in different manners and at distinct layers of a network's protocol hierarchy. Bridges connect two or more local area networks (LANs) at the medium access control (MAC) layer of a LAN. A bridge receiving packets (frames) of information will pass the packets to the interconnected LAN based on some forwarding algorithm selected by the manufacturer. Routers, on the other hand, connect at a higher protocol layer than bridges operating to receive packets from and transmit packets to remote locations. Routers further provide flow control for incoming LAN packets, thereby increasing the reliability of the interconnection, and allowing the use of a variety of interconnection subnetworks. Routers keep and form router tables so that packets can be routed over different paths, for example for security or least-cost-routing reasons.

Network intermediate systems are special case environments because of the unpredictability of the network traffic at any one time. Data may arrive at any port at any time. This makes the design of network intermediate systems more difficult, because of the inability to rely on predictable patterns of traffic to optimize performance.

One prior art approach to network intermediate system architecture is described in U.S. Pat. No. 5,483,640 based on multiple processors with a shared memory. The shared memory in this architecture is connected to input/output processors across a bus which is the backbone of the system, and to a central processor which performs a number of routing functions, including configuring headers on data packets. The data packets which are received from local or remote computers, travel along the backbone bus from the input/output processors to the shared memory. Thus, most data which is received by and transmitted from the router is stored at least temporarily in the shared memory. Moreover, other data structures, such as router tables, are stored in the shared memory. Typically, conventional dynamic random access memory (DRAM) chips are used as shared memory.

The operation of DRAM largely depends on timing synchronous relative to the data flow strobe signals and error detection/correction circuitry, causing dead cycles in the memory access flow. Thus, DRAM use is complicated and limits system throughput. Moreover, since typical DRAM only includes a single memory bank, only one access to memory at a time is processed, further compounding the inherent dead cycles. Therefore, a DRAM shared memory can act as a system bottleneck, slowing down packet routing.

As data is transferred among a conventional DRAM shared memory, the backbone bus and the processor, particularly in a high volume environment, bandwidth becomes critical.

Therefore, a need arises for a more efficient shared memory system, which is capable of handling the high throughput necessary in intermediate network systems, and other high performance data processing systems.

SUMMARY OF THE INVENTION

The present invention provides a shared memory architecture based on the use of synchronous dynamic random access memory SDRAM as the shared memory. The SDRAM based shared memory executes read, write and refresh requests for access to the memory in a pipeline fashion. In the shared memory architecture, a plurality of data paths are coupled to the shared memory which generate requests for access to the shared memory. These requests have characteristics including a starting address, a length and an access type, which are processed in a memory controller coupled to the shared memory. The memory controller stores requests from the plurality of paths, supplies a current request for access to the shared memory pipeline, and selects a next request from the stored request for access to the shared memory pipeline. The memory controller includes logic responsive to the characteristics of the request or requests currently being executed in the shared memory pipeline and to the characteristics of pending requests, to select a next request for access to improve pipeline fullness, according to one embodiment of the invention.

According to another aspect of the invention, the memory controller includes logic responsive to configuration parameters to control the priority of data paths sharing the memory. The configuration parameter, according to one aspect of the invention, comprise a data path priority parameters, in order to best manage the latency of stored requests from the plurality of data paths. According to this aspect of the invention, one of the plurality of data paths can be given highest priority, and be processed ahead of requests from other data paths. This provides protection to the high priority data path to ensure best case access to the shared memory.

According to another aspect, the memory controller includes logic that selects requests from the plurality of stored requests in order to best manage pipeline fullness. For example, the characteristics of the pending requests can be compared to the characteristics of the request or requests currently being executed in the pipeline, and a next request can be selected based on a priority which assigns a higher priority to accesses of the same type as a request currently in the pipeline, which assigns a higher priority to a next request which is an access to the same line of data in the SDRAM as in the current request in the pipeline, and which give higher priority to a next request to a second bank in the SDRAM.

According to another aspect, the present invention can be characterized as a network intermediate system which comprises a backplane bus coupled to a plurality of input/output nodes and to a central processing node, which includes shared memory comprising synchronous dynamic random access memory. The central processing node and the plurality of input/output nodes generate requests for access to the shared memory which have characteristics including starting address, length and type, as mentioned above. A memory controller is implemented to manage the shared memory pipeline as discussed above. In this system, with the backplane bus, the central processing node, and refresh requirements of the SDRAM all competing for bandwidth in the shared memory pipeline, the system is managed to optimize throughput of network packages which are received and processed by the system.

Thus, a higher performance shared memory system is based on synchronous dynamic random access memory. The synchronous interface to the SDRAM allows for higher frequency operation than prior art shared memory systems. The shared memory is able to provide service to more than one source of data transfer traffic into and out of the memory. The transfer requests from the sources may be completely independent, and an arbitration mechanism is provided to choose between the competing sources. A bandwidth optimized arbiter can be designed that chooses the next request based on the ability of the SDRAM to start the SDRAM access immediately at the completion of a current transfer. This arbiter needs to consider the location, size and direction, (type) of the transfer to achieve this optimum arbitration decision. The SDRAM controller/arbiter also handles multiple bursts transfers to and from a single source.

The use of synchronous memory as shared memory in a data processing system provides an extra level of control over the data path throughput not available to prior art systems. Because all requests to the memory are processed in a synchronous manner, greater control over pipeline fullness, and over latency of a preferred data path can be provided. Thus, a fewer number of dead cycles will be encountered in shared memory systems based on SDRAM, and better overall throughput can be achieved.

Other aspects and advantages of the present invention can be seen upon review of the drawings, the detailed description and the claims which follow.

DETAILED DESCRIPTION

Figure 1:
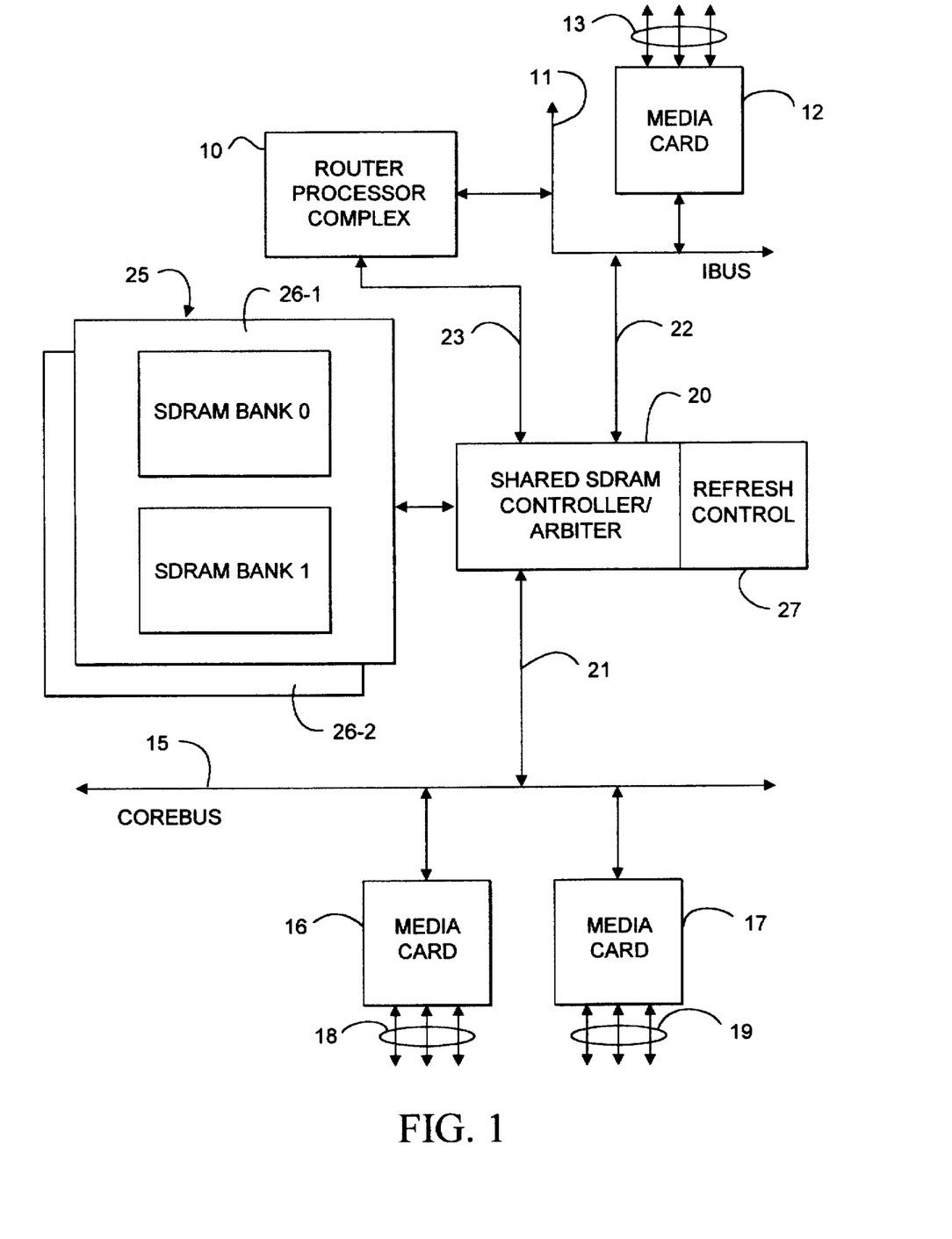
FIG. 1 is a simplified block diagram of a shared memory system according to the present invention.
Figure 2:
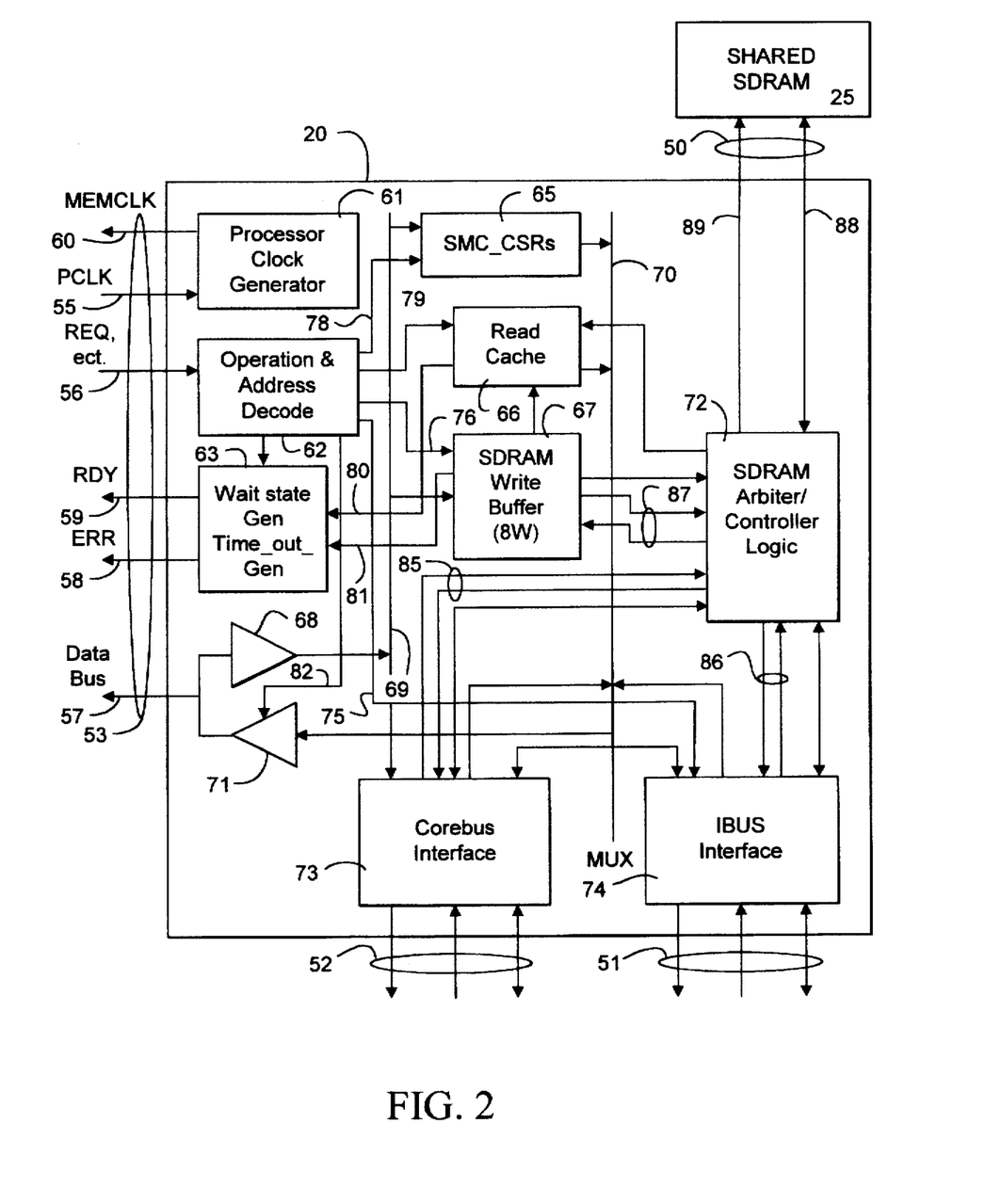
FIG. 2 is a functional block diagram of the shared memory interface of the present invention.
Figure 3:
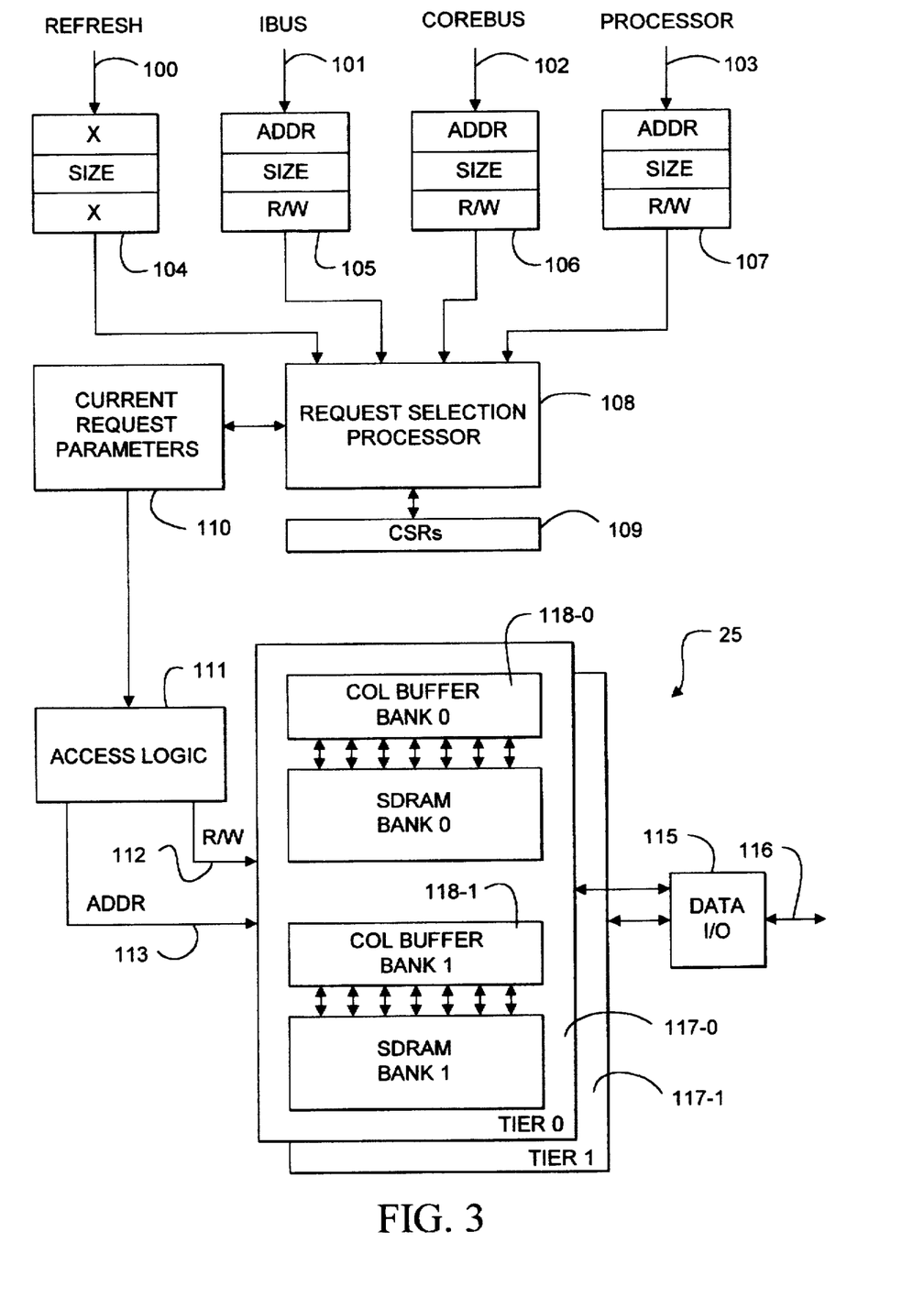
FIG. 3 is a simplified block diagram of a shared memory arbiter/controller of FIG. 2 according to the present invention.

A detailed description of embodiments of the present invention is provided with respect to FIGS. 1–8, in which FIGS. 1–3 illustrate the hardware environment of the present invention, and FIGS. 4–8 illustrate the processes executed for managing throughput using synchronous dynamic random access memory as shared memory, according to the present invention.

FIG. 1 shows the basic shared memory system according to the present invention. The shared memory system in this aspect comprises a network intermediate system or router. Thus, the system includes a router processor complex 10 which executes software for managing the interconnection in the plurality in types of networks using industry standard processes and the like. The router processor complex includes a high performance processor, and memory for storing the programs used by the processor complex. Coupled to the compressor complex 10 is an internal bus 11 in this embodiment. The internal bus 11 is coupled to at least one local media interface 12 in this embodiment, which includes a plurality of input/output ports 13 connected to networks or other sources of data packets. Also coupled to the system is a backplane bus 15. The backplane bus 15, termed corebus herein, is coupled to one or more media cards 16, 17, which in turn include a plurality of input/output ports 18 and 19, respectively. The corebus 15, the internal bus 11, and the processor complex 10 are all coupled to a shared SDRAM controller/arbiter 20 across lines 21, 22, and 23, respectively. The controller/arbiter 20 is coupled to an SDRAM shared memory system 25 which includes a first tier SDRAM chip 26-1, and a second tier SDRAM chip 26-2. Also coupled to the controller/arbiter is a refresh control unit 27, which manages refresh in the SDRAM memory according to the industry standard processes. A suitable SDRAM product may be, for example, the NEC UPD4516821, or a variety of industry standard SDRAM devices.

The basic operation of the system having the architecture in FIG. 1, is based on the data packet flow through the input/output ports 18, 19, 13. Data packets are received on a particular I/O port, such as one of the ports on media card 17, transferred across the corebus 15 into the shared memory system 25. The router processor complex 10 is notified the packet has been stored in the shared memory system 25, processes the packet header and forwards the packet out to the proper I/O port in the system. Thus, throughput of the router system of FIG. 1 is largely dependent on the data flow into and out of the shared memory system. As a plurality of data paths request access to the shared memory system, management of the shared memory pipeline becomes critical.

FIG. 2 illustrates the address and data paths in the shared SDRAM controller/arbiter 20. The controller/arbiter 20 includes a shared SDRAM interface 50, an internal bus interface 51, a corebus interface 52, and a processor complex interface 53.

The processor interface 53 includes input processor clock PCLK 55, request lines REQ, including address lines and other control signals, on line 56, and the data input/output line 57. The controller 20 provides the output signals indicating error on line 58, the ready signal on line 59, and a memory clock on line 60.

The processor clock on line 55 is supplied to a processor clock generator 61 which produces the memory clock on line 60 for use by the processor complex. The request signal, with address and other control signals on line 56 are supplied to operation and address decode logic 62. The operation and address decode logic 62 supplies control signals to a wait state and time out generator block 63, which in turn supplies the ready signal on line 59 and the error signal on line 58 in appropriate conditions. The operation and address decode logic 62 also provides access to control state registers 65 in the shared memory controller, a data read cache 66 (DRC) for the processor interface and a processor write buffer 67 (PWB) for the processor interface.

The data input on line 57 is supplied through an input buffer 68 to a bus 69 which routes data from the processor interface through the state registers 65 or the write buffer 67. The state registers 65, read cache 66 and write buffers 67 are coupled to an internal data bus 70, which is also coupled to the output driver 71 on the data line 57. The bus 70 is also coupled to the SDRAM arbiter/controller logic 72, corebus interface logic 73, and to internal bus interface logic 74.

The operation and address decode logic 62 on the processor interface is connected by line 75 to the corebus and internal bus interfaces 73 and 74, by line 76 to the write buffer, by line 77 to the read cache, and by line 78 to the control state registers 65. Read cache 66 and write buffer 67 provide control signals on lines 80 and 81 to the wait state and time out generators 63. Also, the operation and address decode logic 62 provides an enable signal on line 82 to the output buffer 71 for driving the data bus line 57. Control signals are traded across line 85 between the corebus interface 73 and the arbiter/controller logic 72. Control signals are traded across line 86 between the internal bus interface 74 and the arbiter/controller logic 72. Also, control signals are traded across line 87 between the write buffer 67 and arbiter/controller logic 72.

Bus 70 in this architecture acts as a multiplexer for sources of input/output data for the shared SDRAM arbiter/controller logic 72. The arbiter/controller logic 72 includes the refresh timer to ensure that the shared SDRAM 25 is refreshed in a timely manner. The arbiter/controller 72 selects requests for the shared memory pipeline as discussed above, in order to optimize access to the shared memory from the plurality of sources. Thus, input/output data are coupled to the shared SDRAM 25 across line 88, and control and address signals are provided to the shared SDRAM 25 across line 89.

FIG. 3 is a conceptual diagram of the shared memory arbiter/controller logic 72 of FIG. 2. Thus, as shown in FIG. 3, there are 4 sources of access to the shared memory system, including the refresh path 100, the internal bus path 101, the corebus path 102, and the internal processor complex path 103. Requests from each of the paths, include a starting address, a size and a direction indicating whether the access is for read or write. (In the refresh path 100, the address and read or write parameters are not utilized.) Each request is stored in a buffer represented by blocks 104 through 107 in the figure. The buffers 104 through 107 are coupled to a request selection processor 108. The request selection processor 108 is coupled to the control state registers 109 to provide parameters for the selection process. Also, requests which are currently in the shared memory pipeline are monitored in block 110. A current request is provided to access logic 112 associated with the shared memory system 25. The access logic provides a read/write control signal on line 112 and an address on line 113 to the shared memory system 25. The input/output data is coupled through buffer 115 to the shared memory system 25 across line 116 from the arbiter/controller logic. The shared memory system 25 includes in this example a first tier 117-0 and a second tier 117-1. Each tier includes a first bank, bank 0, and a second bank, bank 1. Associated with each bank of memory in the shared SDRAM is a column buffer, including column buffer 118-0 for bank 0 and column buffer 118-1 for bank 1.

The request selection processor 108 is able to select a request synchronously from each of the buffers 104 through 107 in order to manage the shared memory pipeline according to the present invention. Thus, the source of the data, the beginning address of the data, the size of the access and the direction of the access are all utilized in combination with information about current requests pending in the shared memory pipeline, in order to select a next optimum request according to the parameters of the particular implementation.

For many applications, the bandwidth (the number of bytes of data transferred at any given period of time) of the memory structure is a critical parameter that must be maximized. The high performance memory structure can be implemented using synchronous dynamic random access memory SDRAM according to the present invention. The advantages of SDRAM is that it has a clocked or pipelined interface rather than a pulsed, asynchronous interface utilized in standard DRAM memory.

The internal architecture of SDRAM is a JEDEC standard optimized for high performance. This structure includes two banks of memory for each chip which operate independently with a shared command for each data port. Since the SDRAM devices need sometimes to access a location and to deaccess a location, the dual bank structure allows the access/deaccess of the bank to be hidden in the data transfer portion of the other bank. SDRAM facilitates high performance by operating in multiple cycles, or burst mode. Burst mode only requires one command to cause the transfer of two, four, or eight sequential locations in memory to be transferred. This frees the command port to be used to execute the commands needed to access and deaccess the locations for the alternative bank. A final optimization is that the burst transfer can be specified to automatically deaccess the locations when the burst is completed. This eliminates the need to issue a deaccess command for each burst. This deaccess command is still needed in cases where only a partial burst is executed. Using this burst mode access technique, a continuous flow of data to or from the SDRAM can be sustained without the complex control required for prior art DRAM-based shared memory systems. To optimally use the dual bank feature of SDRAM, the SDRAM controller maps the external addresses of a range of sequential locations in SDRAM to switch banks after each burst.

According to the present invention, there are more than one source of data transfer traffic to and from the SDRAM. The transfer requests from these sources are independent, and so an arbitration mechanism is utilized to choose between the competing sources. A bandwidth optimized arbiter can be designed that chooses the next requester based on the ability of the SDRAM to start the SDRAM access immediately at the completion of the current transfer. The arbiter needs to consider the location, size and direction of the transfer to achieve this optimum arbitration decision, along with the parameters of the current access. The SDRAM controller/arbiter also needs to handle multiple burst transfers to and from a single source. Since partial bursts interrupt the bank toggling mechanism, it is necessary to begin a multiple burst transfer on a burst boundary, and coordinate the start and end of actual data transfers to a line with burst cycles. The SDRAM controller/arbiter of the present invention incorporates these optimizing logic features.

Figure 4:
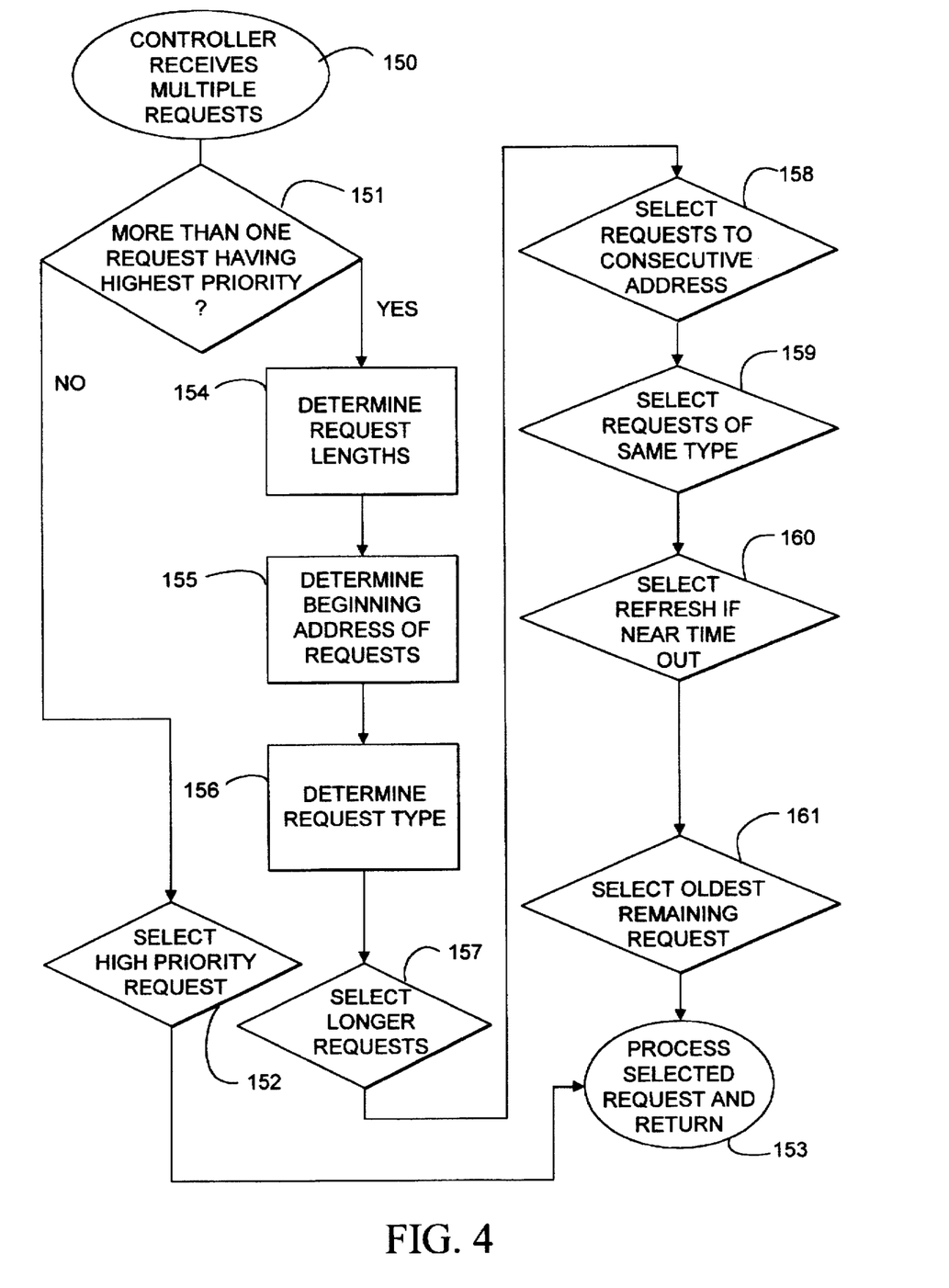
FIG. 4 is a simplified flowchart illustrating the process executed in the shared memory arbiter of the present invention.

Thus, FIG. 4 is a flowchart which fundamentally illustrates the request selection process of the present invention. The process begins when the controller receives multiple requests (block 150). In a preferred system, the controller determines the priority of the source of the plural requests in block 151. If more than one request have the highest priority, then a process must be executed to select the optimum request. If only one request has the highest priority, then the high priority request is selected at block 152, the selected request is processed, and the algorithm returns (block 153).

If at block 151, more than one request had the highest priority, then the algorithm determines the length of the pending request at block 154; determines the beginning address of the pending request (block 155); and determines the request type of the pending request at block 156. Using this information and the information about processes currently in the pipeline, the algorithm selects first longer requests (block 157), then selects requests having consecutive addresses (block 150a), then selects requests of the same type (block 159), then selects the refresh process if it is near a refresh time out at block 160, and then selects the oldest remaining request among the set of requests after filtering by the previous parameters at block 161. The oldest remaining request is processed at block 153 and the process is completed.

A variety of optimizations of this flowchart can be made according to a particular implementation or the needs of a particular design. For example, block 151, based on the priority of the data paths, may be eliminated in order to ensure pipeline fullness to the greatest degree. Furthermore, the priority given to the length, the reliance on consecutive addresses, the request type and the refresh may be optimized or made in different order as suits the needs of the particular design.

In considering the access ordering, access to Bank 0, Bank 1 and again to Bank 0 may occur in sequence. In a situation where Bank 0 is accessed for a "read" and then subsequently accessed for a "write," a "rest" period occurs between the two operations. In the embodiment discussed where the burst length is eight words, the rest period is shorter than a burst length. Therefore, to maximize bandwidth for example, access to Bank 1 for a "write" may take place at the beginning of Bank 0's rest period. In this manner, no cycle time is wasted. The "write" of Bank 0 can then begin at the end of the "write" of Bank 1.

On the other hand, where the sequence of commands for a single bank is several of the same operations, there is no need for a rest to occur between the operations. If, for example, Bank 0 is provided "read" access for two bursts sequentially, no wait state may be required. In this manner, taking into consideration the types of access requests made to the SDRAM, that is, whether the request is a read or write access request, the controller orders them so that dead cycles are avoided.

Using an eight-word burst, the controller can alternate between banks. In this manner, the column buffer will not run out of space between accesses as there is a guaranteed switch on the next burst to the other bank. Thus data in a particular column buffer can be written back to the bank, and then the same one or an entirely different one can be read out to the other bank.

However, data being transferred from multiple sources may be of variable lengths. Also, pipeline fullness may suffer when a "read" or "write" is started in the middle of another burst.

By determining the source of the request and determining, based on particular criteria, the order of the access requests, controller 72 arbitrates access to the SDRAM. Moreover, the controller 72 also provides the actual start and stop control signals to the SDRAM and monitors the process in progress.

In setting up the SDRAM controller configuration, it is important to consider setting up the addressing sequences to further contribute to the overall maximization of bandwidth. The address tables below include information which is used when request candidates are compared to the current access. In other words, because one of the characteristics of the current access is where the current access is located in memory and how long it is, viability of a request candidate will depend the starting point of the request candidate in relation to the current access. The starting point could be more or less critical depending upon which of the different types of configurations are used and where the breakdown of the switching rows occurs. The address configuration information will enter into the decision, but most of the decision making depends on the request, that is, where the data starts, the length of the transfer requested and which direction the data is moving, in or out of the SDRAM, i.e., whether it is a read request or a write request.

The 16Mbit SDRAM devices are 1048576-word by 8-bit by 2-bank, or 524288-word by 16-bit by 2-bank, synchronous dynamic random-access memories. These devices are manufactured by various vendors. While there are JEDEC standards (a 2-bit prefetch configuration and a pipelined configuration), most of the devices diverge in one or more other ways. Preferably, the router of this invention will work with either 2-bit prefetch or pipelined devices. To assure such, this invention is implemented so that there is flexibility in the area that the devices diverge, which is initialization. The initialization sequence is performed by the firmware. All other SDRAM operations: read, write, precharge, and refresh are performed by hardware.

The shared memory devices described here are organized in one, two or four tiers (a tier is a group or external bank of SDRAMs, not shown) of two (x16) or four (8) devices, connected to a common 32 bit data bus, 4 bit mask, 12 bit address bus, and the common control signal. The tiers are selected by four chip selects. In order to make a particular word width, multiple devices are used. That is, for a 32 byte wordwidth, 4 X8 or 2 X16 devices are used. In a two tier system, any command given will need to be addressed to both tiers because they operate simultaneously. If tier 0 or tier 1 is selected, the one which is in operation is actually selected. Thus, certain characteristics to handle switching from one device to another device should be considered. Moreover, if the command were only between rows, columns or banks of a single device, the hierarchy of the impact of the various types of switching should be considered. Below, in Tables 1 and 2, addressing schemes are provided which have been designed to enable switching with the constant consideration of the access requests provided to the controller.

There are common clock enable signals that are connected to a 3.3 V pullup. All of these signals are synchronous to a 50 MHZ clock that is sourced common to the particular router configuration and the SDRAM, which is described in the following section.

As discussed above, the SDRAM receives requests from several sources, including the corebus, the internal data IBUS and the processor. In one embodiment, to maximize the usage of the SDRAM bandwidth, the SDRAMs are preferably operated in burst mode with alternating banks. The banks alternate every 32 B and the mode registers in the SDRAMs are set to an 8 cycle burst by the FW. The SDRAM space is a maximum of 32 MB. The processor address to SDRAM address mappings are shown in Tables 1 and 2. The mapping used would change depending on the architecture of the system and if 16 megabyte SDRAMs or 64 megabyte SDRAMs are used. Preferably, the controller is designed to allow for flexibility in the choice of SDRAM used.

TABLE 3

SDRAM Command Set (minimum)

| Command | Mnemonic | CS̄ | RAS̄ | CAS̄ | WĒ | A11 | A10 | A9:0 |
|---|---|---|---|---|---|---|---|---|
| Mode Register Set | MRS | L | L | L | L | X | X | Val |
| Bank Deactive (Precharge) | DEAC | L | L | H | L | BS | L | X |
| Deactivate all banks | DCAB | L | L | H | L | X | H | X |
| Bank activate/ Row select | ACTV | L | L | H | H | BS | Val | Val |
| Write/Col select | WR | L | H | L | L | BS | L | Val |
| Write/Col select/Auto-deactivate | WRP | L | H | L | L | BS | H | Val |
| Read/Col select | RD | L | H | L | H | BS | L | Val |
| Read/Col select/Auto-deactivate | RDP | L | H | L | H | BS | H | Val |
| No operation | NOOP | L | H | H | H | X | X | X |
| CBR refresh | REFR | L | L | L | H | X | X | X |
| Deselect | DESL | H | X | X | X | X | X | X |

The X8 SDRAMs have 11 bits of Row address, 9 bits of Column address, and one bit of Bank address. The X16 SDRAMs have 11 bits of Row address, 8 bits of Column address, and one bit of Bank address. The mapping in Tables 1 and 2 was chosen to provide optimum operation for processor, corebus and second bus transfers. The bank select signal (SDRAM A11) is associated with memory address A[5] so that the banks alternate every 32 bytes. This allow an efficient second bus 17 transfer flow using back-to-back 32 byte transfers. The first generates 8 data transfers to the A11=0 bank, before the end of the eighth transfer, the A11=1 bank is activated, and the second set of 8 data transfers access this bank. The A11=0 bank is deactivated during the second set of transfers. Due to the decoupling of the two SDRAM banks, the overhead of a second 32 byte transfer can be hidden, and the transfer appears as a continuous sequence of 16 transfers. Another 32 byte transfer can be concatenated to the prior transfers by activating the A11=0 bank during the second set of 8 data transfers. The SDRAMs require that the device be deactivated for a minimum time, cycles, tRP is included in the tAPR and tAPW parameters. Using the typical device parameters, there is a window of 80 ns, or 4 cycles, where the next Activate command can occur to maintain 'ping-pong' operation for a bank select switch on 32 B intervals. The burst continuation feature is also needed for unaligned corebus transfers. The tier select addresses are mapped in as the highest addresses to make the SDRAM spaces have maximum overlap.

The SDRAMs operation is based on commands entered through the RAS/CAS/WE inputs while CS is asserted. The typical device has the commands shown in Table 3.

Regarding the SDRAM burst length timing, the SDRAM transfers results from a sequence of command codes synchronous to the clock pin, rather than by toggling synchronous inputs as in standard DRAM transfers. The first command in the sequence is Activate (ACTV). This command selects the active row for the selected bank and is analogous to the falling edge of the /RAS signal in the standard DRAM. Each of the two

TABLE 1

SDRAM Address Fields for "by8" SDRAMs

| Addr | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|
| Tier | S1 | S0 | | | | | | | | | | | | | | | | | | | | | | | |
| Row | | | A10 | A9 | A8 | A7 | A6 | A5 | A4 | A3 | A2 | A1 | A0 | | | | | | | | | | | | |
| Col | | | | | | | | | | | | | | | | | A8 | A7 | A6 | A5 | A4 | A3 | A2 | A1 | A0 |
| Bank | | | | | | | | | | | | | | | | | | | | | | A11 | | | |
| Byte | | | | | | | | | | | | | | | | | | | | | | | | B1 | B0 |

TABLE 2

SDRAM Address Fields for "by16" SDRAMs

| Addr | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Tier | S1 | S0 | | | | | | | | | | | | | | | | | | | | | | |
| Row | | | A10 | A9 | A8 | A7 | A6 | A5 | A4 | A3 | A2 | A1 | A0 | | | | | | | | | | | |
| Col | | | | | | | | | | | | | | | A7 | A6 | A5 | A4 | A3 | | A2 | A1 | A0 | |
| Bank | | | | | | | | | | | | | | | | | | | A11 | | | | | |
| Byte | | | | | | | | | | | | | | | | | | | | | | | B1 | B0 | defined as tRP. This parameter is vendor and speed grade dependent, but is typically 40–60 ns. For auto-precharge banks 20 and 21 operate independently and can be simultaneously active. When the row has been selected for a minimum time (Trcd), the Read (RD) or Write (WR) command can be asserted. These commands have two variants: one that keeps the row activated, and one that automatically deselects the row at the end of the operation. If the auto-deactivate form of the command is entered, the row is precharged at the end of the data cycles; analogous to the rising edge of /RAS. That bank cannot be reactivated until a time Trp has elapsed. If the non-precharging commands are used, then the row must be explicitly precharged via the deactivate commands (DEAC or DCAB) after the desired number of transfers. The RD and WR command can cause one or more data transfers to occur.

The actual number of data transfer cycles is defined in the burst length field in the Mode Register. The typical SDRAM device has length choices of 1, 2, 4 or 8 cycles. In the address configuration shown above, the Burst Mode is set to 8.

The SDRAM furthermore has a selectable latency from the transfer of the command (read or write) and the execution of the command. This latency selection allows the device to be clocked at a higher rate than the minimum cycle time of the device, since the SDRAM specification defines the spacing between commands to keep these multi-cycle paths from affecting performance. With CAS latency chosen to match the clock frequency, the SDRAM can be made to have one clock per transfer performance. With a value of 2 for the CAS latency of the mode registers, 12 rated devices operate at 50 MHZ.

There is a latency of 2 cycles for read disabling, and 0 cycles for write inhibiting. This does present a problem when the direction of transfer changes. If the current operation is read, the data signals cannot be used to input write data until CL+BL+1 (CAS latency plus Burst Length plus one cycle for bus commutation). Similarly, if the current operation is a write, the next operation cannot begin until all the data has been written to the internal storage array. In this case, the bus commutation and write pipelining occur in parallel. This situation is handled automatically in the SDRAM controller.

Full transfer bursts waste many bus cycles when only a small number of data cycles are required. In a preferred embodiment, the SDRAM controller 18 generates 4 cycle bursts for data transfers of 1 to 4 words by issuing an RD deactivate and issuing a DBK command after 4 cycles. Due to minimum activate time restrictions (TRAC), it may not be possible to shorten the burst any further. For either long burst (8W) eight words (word equal to bytes) or short burst (4W) the SDRAM controller 20 automatically asserts the DQM signal for the cycles where data transfers should not occur due to the address alignment or the word count.

Regarding the SDRAM read access, this type of access can be split into four types: short burst, single burst, double burst, and triple burst. The short burst is generated when the size of the data transfer is 4W or less and the transfer does not cross an 8W boundary. Single bursts are generated when the size of the data transfer is 8W or less and the data transfers do not cross an 8W address boundary. If the data transfer crosses one 8W boundary, which is a possibility on corebus 15 or second data bus 11 read transfers, a double burst transfer is generated. If the data transfer crosses two 8W boundaries, which is a possibility on the second bus data line 11, a triple burst transfer is generated.

The corebus 15 interfaced with the SDRAM generates word aligned read requests with sizes from 1W to 8W. If the transfer is a short burst or a single burst SDRAM accesses (i.e. no 8W address crossing), then the SDRAM controller generates a non-8W aligned burst read to the SDRAMs. The data for the requested address is returned on the first data cycle of the SDRAM and is returned to the corebus 15 with the minimum latency. If the initial data access is to a non-8W boundary, then the SDRAM bursts must occur on 8W boundaries. If the initial data access is to a non-8W aligned address, the SDRAM controller will 8W-align the address and automatically delay the read ACK until the first data word is ready from the SDRAMs. The SDRAM controller 20 generates successive burst request until all of the data transfers have been completed. The final SDRAM burst read may supply more data than the corebus 15 requested, but this only results in a delay before the next SDRAM access can begin. The SDRAM controller 20 is optimized for short burst and single burst operation.

The internal bus 11 interface may generate word aligned read requests with sizes from 1W to 16W. If the transfer is a short burst or single burst SDRAM accesses (i.e. no 8W address crossing), then the SDRAM controller 20 generates a non-8W aligned burst read to the SDRAM. The data for the requested address is returned on the first data cycle of the SDRAMs and is returned to the internal bus 11 with the minimum latency. If the transfer crosses an 8W boundary, then the SDRAM bursts should occur on 8W boundaries. If the initial data access is to a non-8W aligned address, the SDRAM controller will 8W-align the address and automatically delay the read ACK (discussed below) until the first data word is ready from the SDRAMs. The SDRAM controller 20 generates successive burst read requests until all the data transfers have been completed. The final SDRAM burst read may supply more data than the second data bus 11 requested, but this only results in a delay before the next SDRAM access can begin. Thus, the SDRAM controller is optimized for short burst and single burst operation.

The processor data read cache (DRC) generates word aligned 8W read requests to the SDRAM controller 20. The requests generate a single burst read independent of the alignment. Instead of crossing an 8W boundary, the burst wraps around. For example, if the DRC makes a read request with address [4:2] equal to 6 (i.e. ADX=0x00000018), then the data transferred to the DRC is: 6, 7, 0, 1, 2, 3, 4, 5. The DRC controller writes the data into the cache in this sequence, so all the data cycles are used on DRC read requests.

Regarding the SDRAM write access, the accesses can be split into four types, short burst, single burst, double burst and triple burst. The short burst access is generated when the size of the data transfer is 4W or less and the transfer does not cross an 8W address boundary. Single bursts are generated when the size of the data transfer is 8W or less and the data transfers do not cross an 8W address boundary. If the data transfer crosses one 8W boundary, which is a possibility on the corebus 15 or the internal bus 11 write transfers, a double burst transfer is generated. If the data transfer crosses two 8W boundaries, which is a possibility on second bus 11 write transfers, a triple burst transfer is generated.

The corebus 15 interface generates word aligned write requests with sizes from 1W to 8W. If the transfer is a short burst or single burst SDRAM access (i.e. no 8W address crossings), then the SDRAM controller 18 generates a non-8W aligned burst write to the SDRAM. If the data transfer is less than 4 words in a short (4W) burst, or less than 8 words in a single (8W) burst, the SDRAM controller 18 automatically activates the DQM signals to mask the rest of the data write cycles. If the transfer crosses an 8W boundary, then the SDRAM bursts should occur on 8W boundaries. If the initial data access is to a non-8W aligned address, the SDRAM controller 20 will 8W-align the address and automatically delay the write ACK until the first data word needs to be written to the SDRAM. The SDRAM controller 20 generates successive burst write requests until all the data transfers have been completed. Any SDRAM data write cycles before the starting address or after the final address are automatically masked by the SDRAM controller 20. The corebus controller generates a Byte Enable (BE) signal to the SDRAM controller 20 synchronous with the data transfers that enables the associated byte lane to be written to the SDRAM using the DQM signals. The corebus specification allows byte and half-word write operations. All other corebus 15 transfer sizes are full word writes.

The internal bus 11 interface generates word aligned write requests with sizes from 1W to 16W. If the transfer is a short burst SDRAM access (i.e. no 8W address crossings), then the SDRAM controller 28 generates a non-8W aligned burst write to the SDRAM. The data for the requested address is output on the first data cycle to the SDRAM. If the data transfer is less than 4 words in a short (4W) burst, or less than 8 words in a single (8W) burst, the SDRAM controller 18 will 8W-align the address and automatically delay the write ACK until the first data word needs to be written to the SDRAM. The SDRAM controller generates successive burst write requests until all the data transfers have been completed. Any SDRAM data write cycles before the starting address or after the final address are automatically masked by the SDRAM controller 18. The internal bus 17 controller passes the Byte Enable (CNT/BE) signal from the internal bus 17 to the SDRAM controller 18 synchronous with the data transfers that enables the associated byte lane to be written to the SDRAM. The internal bus 17 allows all write operations to be byte-write masked. The internal bus 17 to SDRAM data/mask path through a router of a preferred embodiment has only one cycle of delay. The output transceiver/drivers are connected to the internal bus 11 input I/O flip flops directly.

The processor write buffer (PWB) 67 generates aligned 4W write requests to the SDRAM controller 72. The requests generate a short burst write. The PWB supplies byte lane enables synchronous with the data transfer that control what data is actually written into the SDRAM.

As mentioned above, the SDRAM requires contiguous refresh cycles to maintain data content. Since the access of the data is random, but continuous, the (auto) refresh command (REFR) is used to refresh the memory array. Each SDRAM memory or tier requires that every row in both banks (a total of 4096), be refreshed. These cycles are generated by the controller 20 to the SDRAM array, and are arbitrated to the processor 10, corebus 15 and second bus 11 requests. The characteristics of the refresh function are controlled by two control state registers. A value of 0x0320 causes a SDRAM fresh event request every 16 µs, assuming a 50 MHz ASIC clock. The CSR has a maximum range of 1.31 ms. A refresh event can result in 1 to 4 contiguous refresh cycles. Bits [3:1] of the CSR defines the number of tiers (a tier or group of SDRAMs has a common CS<n>L line). If all three CSR bits are zero then there is only one tier and a single refresh cycle (for CS0L) is generated per SDRAM request. If only bit 1 is a one there are two tiers and refresh cycles are generated for CS0L and CS1L on each SDRAM request. If all three bits are set then there are four tiers and CBR refresh cycles are generated for CS0L, CS1 L, CS2L, CS3L on each SDRAM request. No other bit combinations should be allowed. The SDRAM refresh request generator is enabled by setting bit [31] of the CSR. The SDRAM refresh generator is initially disabled, and should be disabled whenever the refresh period is changed by setting bit [31] of the CSR to 0. The processor 10 can also directly execute SDRAM refresh cycles. This capability is only needed for initialization.

Again, regarding the request, grant and access, as discussed above, there are potentially seven signals associated with the refresher, the corebus 15, read or write the second bus 11 read or write, the processor data read cache (DRC) and processor write buffer (PWB) requesting access to the SDRAM. The requesting interface generates SDRAM requests (both read and write, or just read or write). Simultaneously, the requesting interface generates a 25 bit SDRAM byte address and a four bit size code. The size code is the encoded number of data words to transfer. The SDRAM arbiter of this invention responds with two signals: Grant and Ack. The Grant signal serves as the handshake to the request signal. When the Grant signal is asserted, the requesting interface should drop the current Request. After one cycle, a new Request can be asserted to prepare for the next transfer. The SDRAM controller captures the address and size fields, so the requesting interface can change these to the new values when the new Request is asserted. The Ack signal (acknowledge) is used to indicate the beginning of the data transfer. For read requests, the Ack signal indicates that the first word will appear on the data out bus from the SDRAM interface on the next clock. For write requests, the Ack signal indicates that the first word was just written and the second data word should be supplied on the next clock. Since the second bus 11 writes are not buffered in the preferred embodiment of this invention, the second bus 11 write Ack is generated sufficiently ahead of the SDRAM data transfer to allow the second bus 11 data transfer to begin in time for the first data cycle. The end of data transfer is not indicated, and the requesting interfaces are required to obey the address and size fields asserted with the data transfer request. Accordingly, the SDRAM has seven possible request types to service, from four different sources: corebus read and corebus write, internal bus read and internal bus write, processor read (DRC) and processor write (PWB), and the refresh generator. Each of these seven types have different effects on system performance, and this may be changed based on the system in which the router is located. For this reason, the priority, or order of arbitration, is programmable to allow the most critical requester to be services before the lower priority requesters. In accordance with one embodiment, this priority order is static, programmed once at initialization time. In an alternative embodiment, this priority is provided by a dynamic element. The individual requesters can be disabled if they are not present, for example, the internal bus 17.

FIGS. 5 through 8 illustrate the shared memory pipeline flows for the possible requests in the system of FIGS. 1–3. Utilizing this information, an arbiter/controller can be implemented to optimize pipeline fullness, while providing priority to the data paths as necessary based on the source of the request.

FIGS. 5–8 show these transfer types individually and in combinations. Each transfer shows the associated data cycles. The intention of the diagrams is to show the proximity of the data cycles for sequential transfers. This determines the data transfer bandwidth of the SDRAM interface. Factors that affect the overall data transfer bandwidth of the SDRAM are noted in the discussion of the transfer sequences. The other important characteristic of the SDRAM interface is the latency between the request for the SDRAM and the start of the SDRAM transfer. This is purely a function of the how complex the arbitration selection algorithm is and how much logic can be placed between the state elements of the arbiter.

Figure 5:
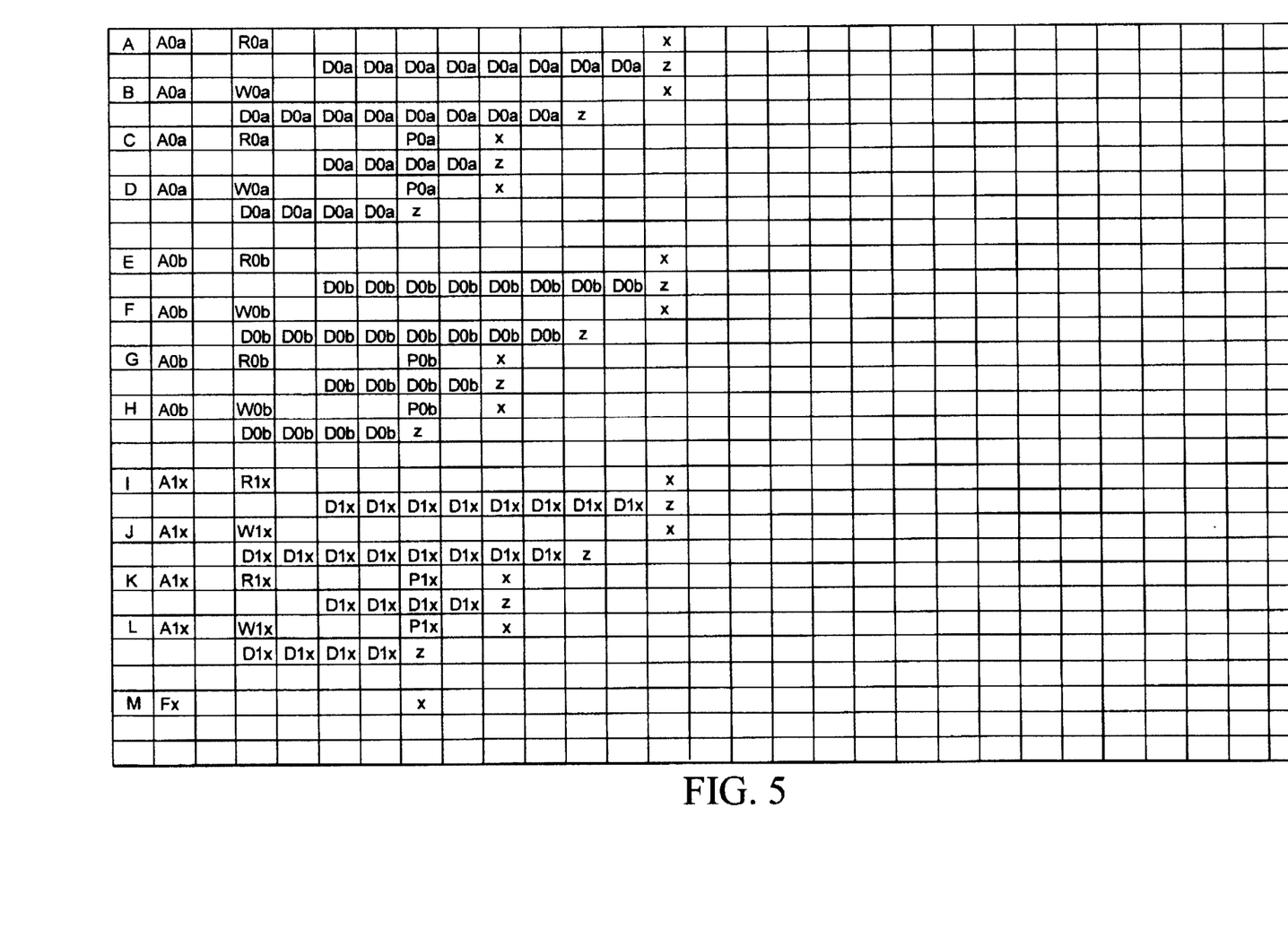
FIG. 5 is a chart illustrating the shared memory access pipeline flows for individual SDRAM transfers used with the present invention.

FIG. 5 shows the individual SDRAM transfers for a two tier (two device) system. They are labeled A through M.

A—8 cycle read from device 0 bank a
B—8 cycle write to device 0 bank a
C—4 cycle read from device 0 bank a
D—4 cycle write to device 0 bank a
E—8 cycle read from device 0 bank b
F—8 cycle write to device 0 bank b
G—4 cycle read from device 0 bank b
H—4 cycle write to device 0 bank b
I—8 cycle read from device 1 bank a/b
J—8 cycle write to device 1 bank a/b
K—4 cycle read from device 1 bank a/b
L—4 cycle write to device 1 bank a/b
M—CBRrefresh cycle The transfers are coded on two lines; first the command sequence, under that the data cycles. The refresh cycle has no associated data, so it only has a command sequence. The command sequences are coded with a three character identifier. The first character identifies the command: A=activate, R=read, W=write, P=deactivate (precharge), F=refresh. The second character identifies the device. All transfer sequences start with device 0. This is arbitrary and does not represent any required address mapping. Subsequent transfers use the device identifier to indicate if that transfer is to/from the same or a different SDRAM. The last character identifies the bank within the SDRAM. The SDRAMs that are used are dual bank devices. Each bank can be operated semi-independently. There is no dependency between banks of different devices, so those transfers use an "x" to indicate either bank a or b. Where there is no command specified the Noop command is assumed. The data transfers, beginning with a "D", are coded to be similar to the command that invokes them.

Figure 6:
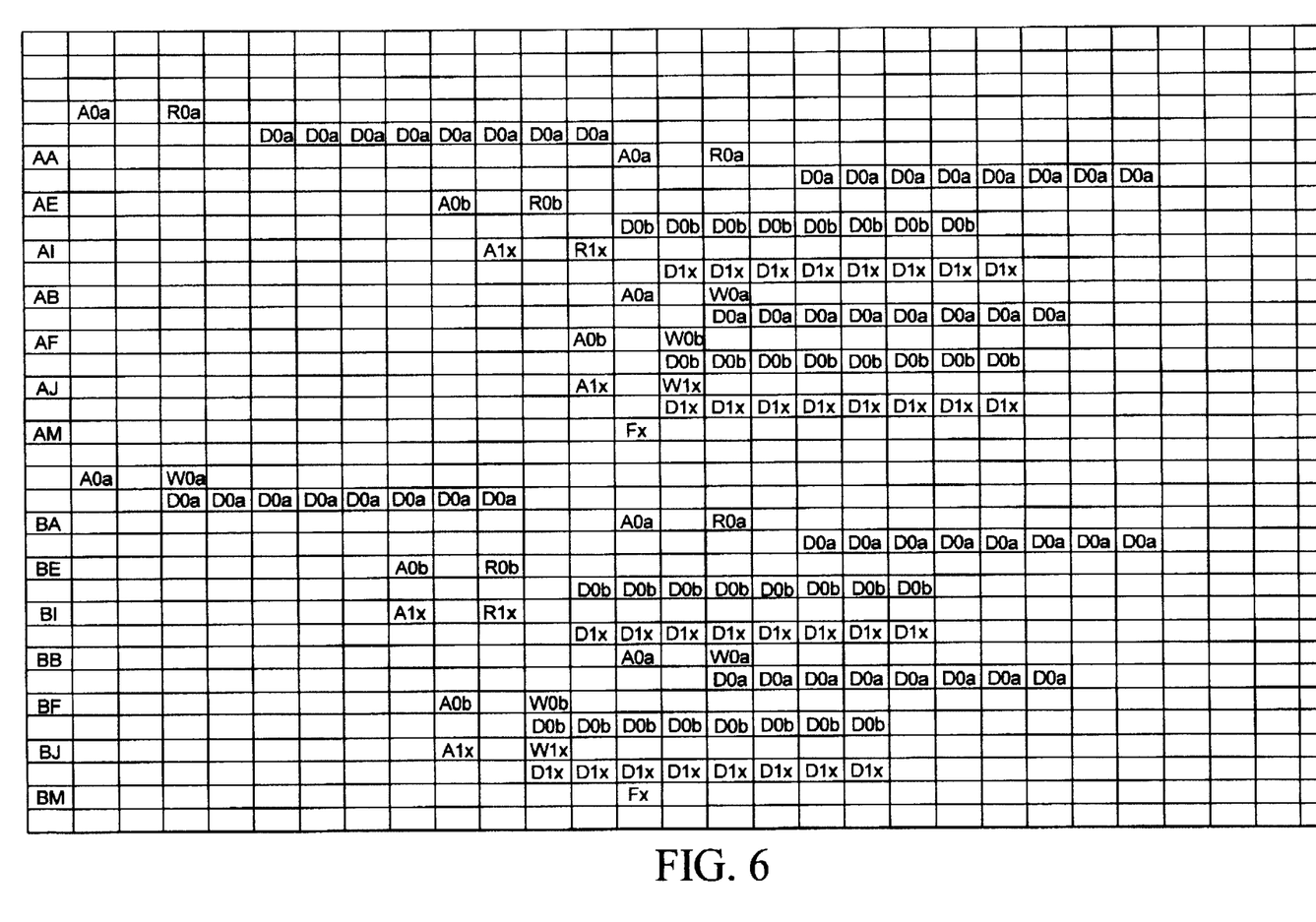
FIG. 6 shows combinations of back to back SDRAM operations according to the present invention.
Figure 7:
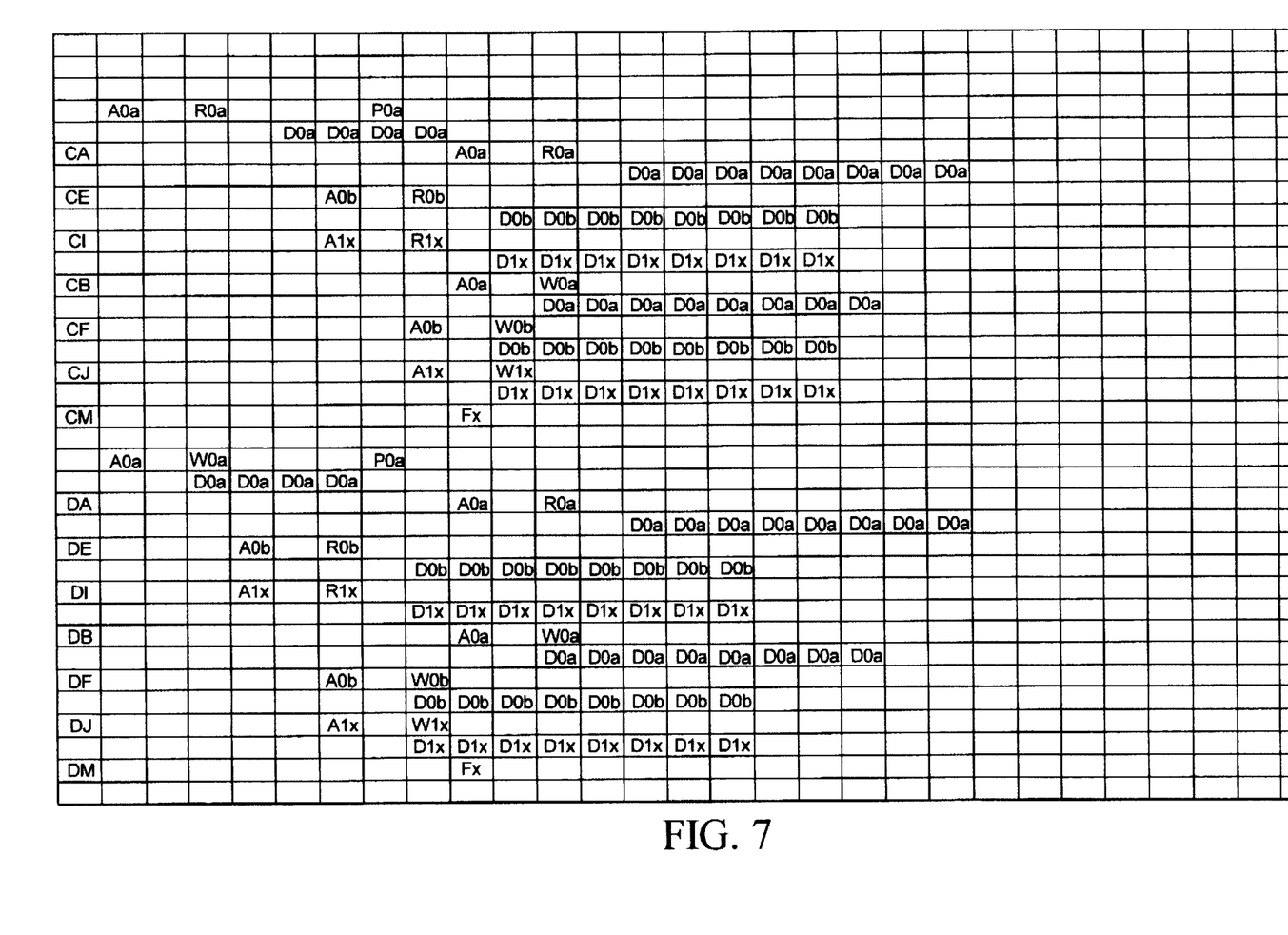
FIG. 7 shows some additional back to back SDRAM operations according to the present invention.

FIGS. 6 and 7 show all the back-to-back SDRAM operations. The initial operation is shown beginning in the second column. The seven possible "next" operations are shown below the initial operation. They are coded with a two letter identifier in column one that corresponds to the transfer codes (from the page one) for the two transfers. The 'spacing' of the two commands is determined by the cycle of the SDRAM bank, the availability of the SDRAM command bus, and the requirement to allow one 'dead' cycle on the SDRAM data bus between different driving devices (either controller or SDRAM). The 8w read and write commands and the refresh command have auto-precharge enabled. The 4w read and write are partial burst operations and require an explicit precharge command.

The first back-to-back transfer shown is an 8w read followed by another 8w read to the same device and bank. The SDRAM requires a precharge time before another activate command can be executed. Because of this restriction, the A0a command cannot occur until the last of the initial data transfers (D0a). The result is a gap of four cycles on the SDRAM data bus between the end of the first transfer and the start of the second transfer.

The second sequence is an 8w read followed by another 8w read to the same device but the other bank. Since the SDRAM banks can be operated independently, the second transfer is limited only by the availability of the command and data buses. The command bus is free before the first transfer of data begins. This means that the commands for the second transfer can be sent on the command bus while the first data transfer is occurring, and the second data transfer begins on the first cycle after the last data cycle in the first transfer. There are no wasted cycles.

The next sequence is an 8w read followed by an 8w read from a different device. In this case the banks are independent, but the second read must be delayed one cycle from the previous case because of the requirement to have one undriven cycle between data bus possessions.

The next three cases are an 8w read followed by an 8w write. The first of these has the write occurring to the same device and bank. This has the same precharge restriction as previous the 8w read case to the same device and bank. Note that there are only two cycles of dead time on the data bus, because the write command starts transferring data two cycles before the read command. The other two cases of 8w read followed by 8w write (different bank and/or different device) are limited by the restriction that there must be a dead cycle on the data bus when switching sources.

The final case is an 8w read followed by a refresh cycle. A refresh command alternates between banks controlled by the SDRAM, so an assumption is made that the sequence is to the active device and bank.

The second back-to-back transfer set in FIG. 6 shows an 8w write followed by each of the 7 operation types. The first case, 8w write followed by 8w read to the same device/bank causes the injection of six dead cycles on the data bus. This is the most that any of the transfer sequences require.

FIG. 7 has the transfer sequences for 4w read and 4w write operations followed by each of the 7 operation types. The difference between the 4w and 8w operations is that they require an additional command (precharge) to end the transfer prematurely. This additional command can interfere with the ideal placement of the commands for the following transfers and can delay those transfers. In the case of a 4w read followed by an 8w read from the same device/different bank, the 8w read could begin to transfer data immediately after the 4w read ends, except that the read command would need to be on the command bus on the same cycle as the deactivate (precharge) command. The only solution is to delay the read command, which results in one dead cycle on the data bus. The same situation occurs in the 4w write followed by 8w write to a different bank or device.

Figure 8:
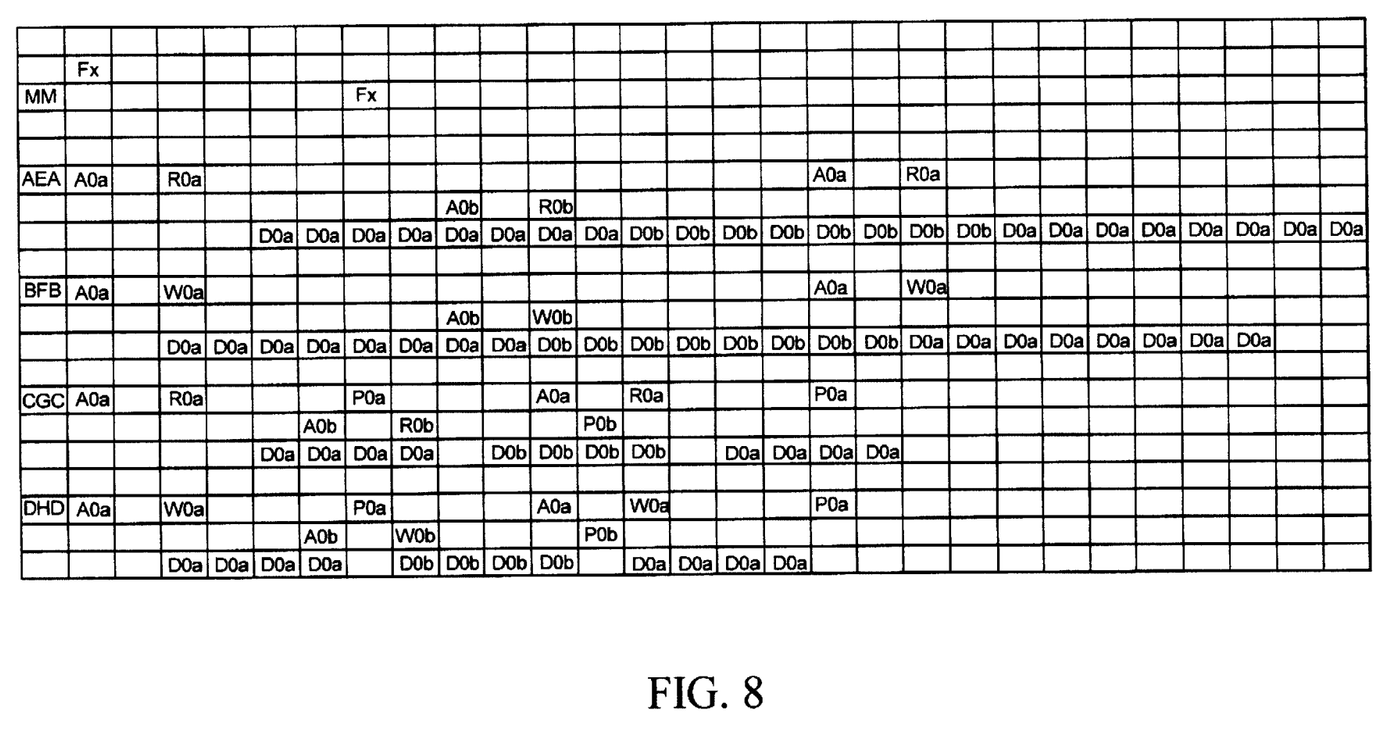
FIG. 8 shows pipeline flows for consecutive refresh cycles, and for cases of sequentially addressed data transfers for the shared memory system of the present invention.

The case of consecutive refresh cycles is shown at the top of FIG. 8. FIG. 8 also shows the four cases of sequentially addressed data transfers. They are shown as three operation sequences, but could be an arbitrary number of sequential data transfers. The first case, AEA, is a stream of three 8w read operations to sequential addresses. As long as no device-device boundaries are crossed, the bank a/bank b sequencing can continue without dead cycles on the data bus. Similarly, the case of a stream of 8w writes is shown on the lines coded: BFB. It can also maintain no-dead-cycle operation. The final two cases are a stream of 4w reads and a stream of 4w writes. Each of these is unable to sustain no-dead-cycle data transfers.

Utilizing the information in FIGS. 5–8, the arbiter is set up with priority logic to optimizing pipeline fullness. For example, for each current request, a priority schedule is coded for each possible following request, and applied to select the next request in the arbiter.

Thus, utilizing synchronous dynamic random access memory, or other synchronous memory in a shared memory system, improved management of the data flow in a network intermediate system such as a router is provided. The shared memory interface can optimize bandwidth by maintaining pipeline fullness for the synchronous memory accesses. Also, the controller can assign priority to certain sources of data as suits the particular design.

In summary, the router of this invention includes synchronous dynamic random access memory (SDRAM) based shared memory, having a controller which is configured to control the order in which SDRAM access is granted to a plurality of interfaced components. In one embodiment, the controller's configuration minimizes the amount of time data from a particular source must wait to be read to and written from the SDRAM and thus minimizes latency. In a different embodiment, the controller's configuration maximizes the amount of data read to and written from said SDRAM in a given amount of time and thus maximizes bandwidth. In yet another embodiment, characteristics of the latency minimization embodiment and the bandwidth maximization embodiment are combined to create a hybrid configuration.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A data processing system, comprising:
    a shared memory comprising synchronous dynamic random access memory SDRAM and a shared memory pipeline coupled to the SDRAM, which executes read, write and refresh requests for access in a pipeline fashion;
    a plurality of data paths coupled to the shared memory which generate requests for access to the shared memory, the requests having characteristics including a starting address, a length and a type; and
    a memory controller, coupled to the plurality of data paths, which stores requests from the plurality of data paths, supplies a current request for access to the shared memory pipeline, and selects from the stored requests, a next request for access for the shared memory pipeline.

2. The data processing system of claim 1, wherein the memory controller includes logic responsive to the characteristics of the request or requests currently in the shared memory pipeline, and to the characteristics of the pending requests to select a next request for access to improve pipeline fullness.

3. The data processing system of claim 1, wherein the memory controller includes logic responsive to a configuration parameter to select a next request for access.

4. The data processing system of claim 3, wherein the configuration parameter comprises a data path priority to manage latency of stored requests from the plurality of data paths.

5. The data processing system of claim 1, wherein the memory controller includes logic responsive to the characteristics of a request currently in the shared memory pipeline, and to the characteristics of the pending requests to give priority to a next request for access of the same type as the request currently in the pipeline.

6. The data processing system of claim 1, wherein the SDRAM includes a column buffer which stores lines of data being accessed in response to a request currently in the pipeline, and the memory controller includes logic responsive to the characteristics of the request currently in the shared memory pipeline, and to the characteristics of the pending requests to give priority to a next request for access to the line of data in the column buffer for the request currently in the pipeline.

7. The data processing system of claim 1, wherein the SDRAM includes a first bank and a second bank accessible independently, and the memory controller includes logic responsive to the characteristics of a request currently in the shared memory pipeline to the first bank, and to the characteristics of the pending requests to give priority to a next request for access to the second bank.

8. A network intermediate system, comprising:
    a backplane bus coupled to a plurality of input/output nodes;
    a central processing node coupled to the backplane bus, including a host processor and a shared memory comprising synchronous dynamic random access memory SDRAM and a shared memory pipeline coupled to the SDRAM, which executes read, write and refresh requests for access in a pipeline fashion;
    the host processor and the plurality of input/output nodes generating requests for access to the shared memory, the requests having characteristics including a starting address, a length and a type; and
    a memory controller, coupled to the host processor and the backplane bus, which stores requests from the host processor and the plurality of input/output nodes, supplies a current request for access to the shared memory pipeline, and selects from the stored requests, a next request for access for the shared memory pipeline.

9. The network intermediate system of claim 8, wherein the memory controller includes logic responsive to the characteristics of the request or requests currently in the shared memory pipeline, and to the characteristics of the pending requests to select a next request for access to improve pipeline fullness.

10. The network intermediate system of claim 8, wherein the memory controller includes logic responsive to a configuration parameter to select a next request for access.

11. The network intermediate system of claim 10, wherein the configuration parameter comprises priority values to manage latency of stored requests, from the host processor and the plurality of input/output nodes.

12. The network intermediate system of claim 8, wherein the memory controller includes logic responsive to the characteristics of a request currently in the shared memory pipeline, and to the characteristics of the pending requests to a next request for access of the same type as the request currently in the pipeline.

13. The network intermediate system of claim 8, wherein the SDRAM includes a column buffer which stores lines of data being accessed in response to a request currently in the pipeline, and the memory controller includes logic responsive to the characteristics of the request currently in the shared memory pipeline, and to the characteristics of the pending requests to give priority to a next request for access to the line of data in the column buffer for the request currently in the pipeline.

14. The network intermediate system of claim 8, wherein the SDRAM includes a first bank and a second bank accessible independently, and the memory controller includes logic responsive to the characteristics of a request currently in the shared memory pipeline to the first bank, and to the characteristics of the pending requests to a next request for access to the second bank.

15. The network intermediate system of claim 8, wherein the central processing node includes a host input/output node which generates requests for access to the shared memory, and the memory controller also stores requests from the host input/output node.

16. A network intermediate system, comprising:
    a backplane bus coupled to a plurality of input/output nodes;
    a central processing node coupled to the backplane bus, including a host processor and a shared memory comprising synchronous dynamic random access memory SDRAM and a shared memory pipeline coupled to the SDRAM, which executes read, write and refresh requests for access in a pipeline fashion;

the host processor and the plurality of input/output nodes generating requests for access to the shared memory, the requests having characteristics including a starting address, a length and a type; and a memory controller, coupled to the host processor and the backplane bus, which stores requests from the host processor and the plurality of input/output nodes, supplies a current request for access to the shared memory pipeline, and selects from the stored requests, a next request for access for the shared memory pipeline, including logic responsive to the characteristics of a request currently in the shared memory pipeline, and to the characteristics of the pending requests to select a next request for access to improve pipeline fullness.

* * * * *